US010578329B2

(12) United States Patent
Chang et al.

(10) Patent No.: US 10,578,329 B2
(45) Date of Patent: Mar. 3, 2020

(54) PERFORMANCE FORECASTING METHOD

(71) Applicant: Chicony Power Technology Co., Ltd., New Taipei (TW)

(72) Inventors: Tse-Wen Chang, New Taipei (TW); Wen-Yen Cheng, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 215 days.

(21) Appl. No.: 15/860,680

(22) Filed: Jan. 3, 2018

(65) Prior Publication Data
US 2019/0107306 A1    Apr. 11, 2019

(30) Foreign Application Priority Data

Oct. 5, 2017    (TW) .............................. 106134396 A

(51) Int. Cl.
| F24F 11/38 | (2018.01) |
| F24F 11/58 | (2018.01) |
| F24F 11/63 | (2018.01) |
| F24F 11/52 | (2018.01) |
| G01K 13/02 | (2006.01) |
| G01R 21/133 | (2006.01) |

(Continued)

(52) U.S. Cl.
CPC .............. *F24F 11/38* (2018.01); *F24F 11/52* (2018.01); *F24F 11/58* (2018.01); *F24F 11/63* (2018.01); *G01F 1/00* (2013.01); *G01K 13/02* (2013.01); *G01K 17/06* (2013.01); *G01R 21/133* (2013.01); *F24F 2110/10* (2018.01); *F24F 2110/20* (2018.01); *F24F 2140/60* (2018.01); *G01K 2013/024* (2013.01)

(58) Field of Classification Search
CPC ....................................................... F24F 11/38
USPC .......................................................... 702/184
See application file for complete search history.

(56) References Cited

U.S. PATENT DOCUMENTS

| 10,404,775 B2 * | 9/2019 | Seaton ..................... F24F 11/38 |
| 2005/0256661 A1 * | 11/2005 | Salsbury .................. F24F 11/30 |
| | | 702/113 |

(Continued)

FOREIGN PATENT DOCUMENTS

| CN | 101975436 A | 2/2011 |
| CN | 203117771 U | 8/2013 |

(Continued)

*Primary Examiner* — Ricky Ngon
(74) *Attorney, Agent, or Firm* — CKC & Partners Co., LLC

(57) ABSTRACT

The present disclosure relates to a performance forecasting method applied to an air conditioning equipment and a central server. The air conditioning equipment has a plurality of detecting elements so as to detect a plurality kinds of physical parameters and a performance parameter. The central server stores those parameters as a set of first parameters and a first performance value. When the central server receives other physical parameters and another performance parameter, it calculates the similarity between the other physical parameters and each set of the first parameters according to the law of cosines. The central server selects the set of the first parameters which have the similarity being greater than a selecting threshold, so as to calculating an expected performance value. Accordingly, the central server can forecast a performance decline degree by comparing the another performance parameter and the expected performance value.

9 Claims, 3 Drawing Sheets

(51) Int. Cl.
*G01K 17/06* (2006.01)
*G01F 1/00* (2006.01)
*F24F 140/60* (2018.01)
*F24F 110/10* (2018.01)
*F24F 110/20* (2018.01)

(56) References Cited

U.S. PATENT DOCUMENTS

| | | | |
|---|---|---|---|
| 2014/0316743 A1* | 10/2014 | Drees | G05B 15/02 |
| | | | 702/184 |
| 2015/0127164 A1 | 5/2015 | Wang et al. | |
| 2017/0300046 A1* | 10/2017 | Kerbel | G05B 23/0235 |

FOREIGN PATENT DOCUMENTS

| | | |
|---|---|---|
| TW | I358516 B1 | 2/2012 |
| TW | I364519 B1 | 5/2012 |
| TW | I470217 B | 1/2015 |
| WO | 2013/005260 A1 | 1/2013 |

\* cited by examiner

PERFORMANCE FORECASTING METHOD

RELATED APPLICATIONS

This application claims priority to Taiwan Application Serial Number 106134396, filed Oct. 5, 2017, which is herein incorporated by reference.

BACKGROUND

Technical Field

The present disclosure relates to a performance forecasting method. More particularly, this method is able to establish a comparison database according to the data detecting by detecting elements, and then analyzes and infer a performance decline degree of an air conditioning equipment when it is in operation.

Description of Related Art

Currently, in the process of heat exchange between an air conditioning equipment (e.g. water-cooled mainframe, heat pump engine, air heat exchange regulator, cooling water tower) and external environment, the performance of the air conditioning equipment will slowly decline with time. The reason why the air conditioning equipment declines is due to dust particles or other pollutants in the air, along with external fluids (gases or liquids), that enter the surface of the heat exchanger. After long term operation, dust particles or pollutants accumulate into dirt and cause a negative effect to the heat exchange efficiency of the air conditioning equipment.

The accumulation of dirt will not only reduce the heat exchange effect, but also cause problems such as the increase of energy consumption, the unexpected performance of air conditioning, etc. Therefore, traditionally, the user must maintain the air conditioning equipment regularly, or judge the performance of the air conditioning equipment through sensors. However, the aforementioned method must be checked regularly by the maintenance staff or through periodic analysis of the large data detected by the sensors in order to identify and replace the declining component. Therefore, it is not only complicated but also time-consuming.

Therefore, there is an urgent need for a performance forecasting method to be used to analyze in real time the parameters detected by sensors, and to accurately determine a performance decline degree of the air conditioning equipment.

SUMMARY

The present disclosure provides a performance forecasting method applied to an air conditioning system, wherein the air conditioning system at least comprises an air conditioning equipment and a central server. A plurality of detecting elements are arranged on the air conditioning equipment and configured to detect a plurality of physical parameters and a performance value of the air conditioning equipment. The central server is connected to the plurality of detecting elements through wireless connection or wired connection. The performance forecasting method comprises the following steps: first, the central server receiving the plurality of physical parameters and the performance value detected by the plurality of detecting elements at every predetermined interval, and storing the plurality of physical parameters and the performance value as a set of first parameters and a first performance value. Second, the central server establishing a comparison database based on the stored each set of the first parameters and the first performance values corresponding to each set of the first parameters. Then, the central server receiving other physical parameters and another performance value detected by the plurality of detecting elements and storing the other physical parameters and the other performance value as a set of second parameters and a second performance value. After that, the central server calculating the similarity between the set of the second parameters and each set of the first parameters in the comparison database according to the law of cosine. The central server further selecting out the sets of the first parameters which have the similarity being greater than a select threshold, and calculating an expected performance value based on the plurality of the first performance values corresponding to the selected plurality sets of the first parameters. Finally, the central server calculating an error value between the expected performance value and the second performance value to determine a performance decline degree of the air conditioning system.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the invention. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
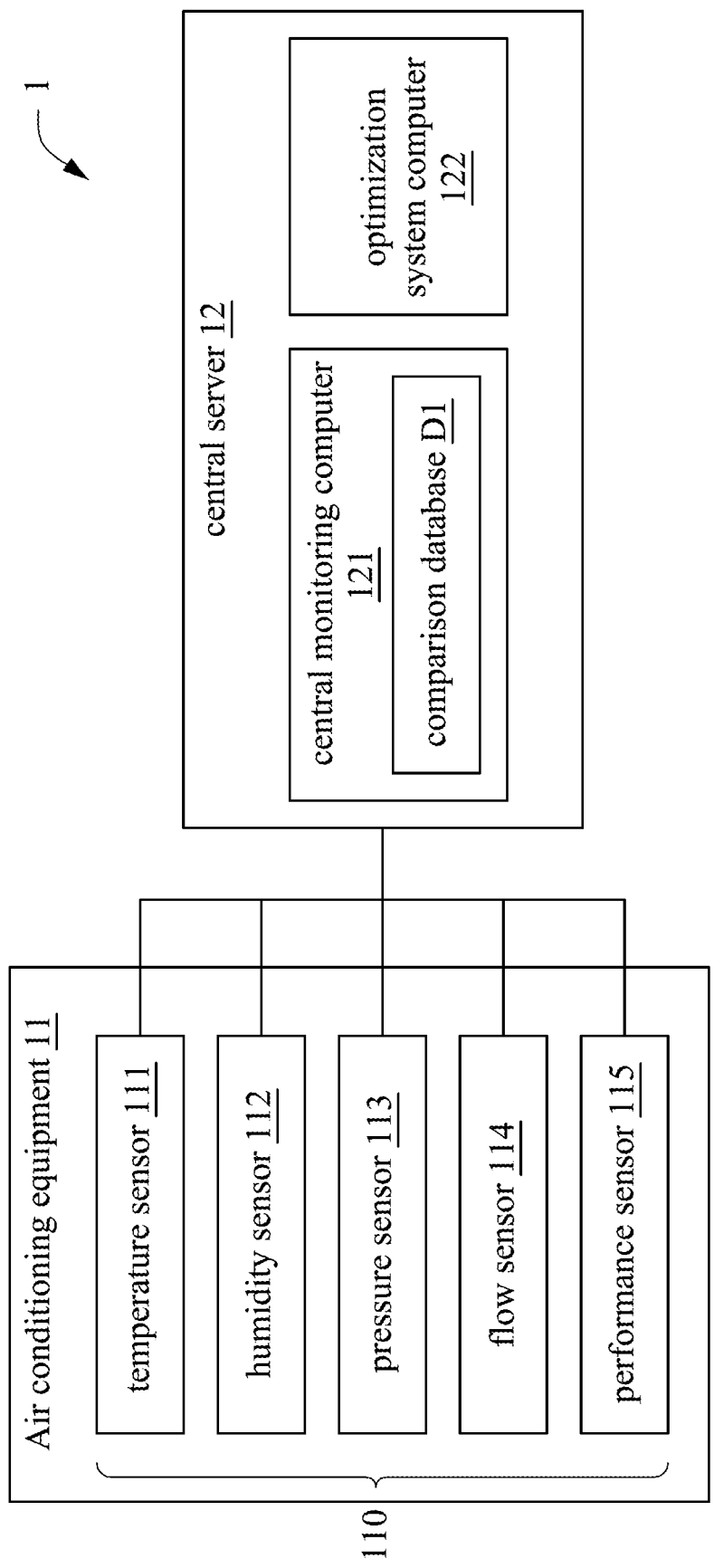
FIG. 1 shows a schematic diagram of an air conditioning system for one embodiment of the present disclosure.

The present disclosure discloses a performance forecasting method. Reference is made to FIG. 1, which is one of the air conditioning system 1 used in one embodiment of the present disclosure. The air conditioning system 1 at least includes an air conditioning equipment 11 and a central server 12. The air conditioning equipment 11 is equipped with a plurality of detecting elements 110. The plurality of detecting elements 110 are configured to detect physical parameters (e.g. temperature, flow rate or humidity) and a performance value (e.g. power consumption or heat exchange efficiency) of the air conditioning equipment 11.

In one embodiment, the detecting elements 110 include a temperature sensor 111, a humidity sensor 112, a pressure sensor 113, a flow sensor 114 and a performance sensor 115. These sensors 111-114 are configured to detect the physical parameters such as temperature, humidity, gas or liquid pressure and gas or liquid flow rate, respectively. The performance sensor 115 is used to detect the performance of the air conditioning equipment 11 such as power consumption or heat exchange power.

In the present disclosure, the type and number of the detecting elements 110 are not limited to FIG. 1 but depend on the actual type of the air conditioning equipment 11. Five common types of air conditioning equipment are discussed below:

(1) Water-cooled mainframe and water-to-water heat pump: in this kind of air conditioning equipment, the detecting elements include a temperature sensor, a flow sensor and an electric power detector, which can detect the input and output water temperature and the flow rate at the high-pressure end and low-pressure end respectively, and can calculate the power consumption.

(2) Air cooled mainframe: in this kind of air conditioning equipment, the detecting elements include a temperature sensor, a liquid flow sensor, a gas flow sensor and an electric power detector. These sensors can detect the input/output air flow temperature at the high pressure end, gas flow rate, the input/output water temperature at the low pressure end, liquid flow rate and equipment power consumption.

(3) Air-to-water heat pump: in this kind of air conditioning equipment, the detecting elements include temperature sensor, gas flow sensor and electric detector. The sensors can detect the input/output air flow temperature at the low pressure end, the gas flow rate, the input/output water temperature at the high pressure end, the liquid flow rate and the power consumption of the equipment, respectively.

(4) Air handling unit equipment: in this kind air conditioning equipment, the detecting elements include a temperature sensor, a humidity sensor, a gas flow sensors, and a liquid flow sensor. These sensors can detect the temperature/humidity at the inlet end and outlet end, the gas flow rate, the input/output water temperature at the coil unit and the liquid flow rate, and can calculate the heat exchange rate.

(5) Cooling water tower: in this kind of air conditioning equipment, the detecting elements include a temperature sensor, a humidity sensor, a gas flow sensor and a liquid flow sensor. The sensors can detect the temperature/humidity at the inlet end and the outlet end, the gas flow rate, the input/output water temperature and the liquid flow rate at the water tower end and can calculate the heat exchange amount.

The central server 12 is connected to the detecting elements 110 through wireless connection or wired connection. In one embodiment, the central server 12 includes a central monitoring computer 121 and an optimized system computer 122 which are electrically coupled with each other. The central monitoring computer 121 is a management center for controlling the air conditioning equipment 11 to switch on or off. In present disclosure, the optimization system computer 122 is added on the traditional structure to realize the performance forecasting method in the present disclosure. The optimized system computer 122 is configured to process data operations and analysis to reduce the operating load of the central monitoring computer 121.

Figure 2:
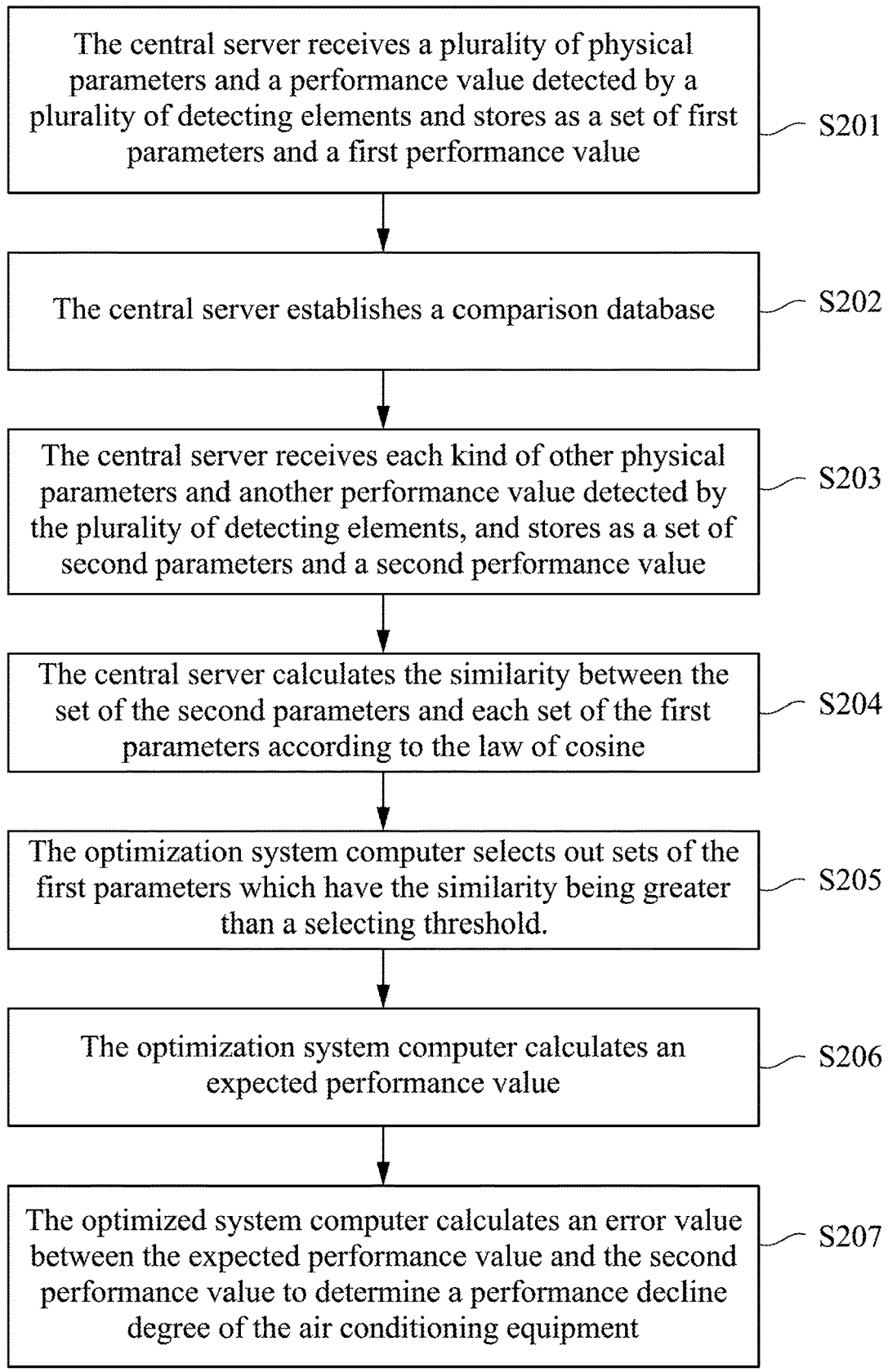
FIG. 2 shows a flow chart of a performance forecasting method for one embodiment of the present disclosure.

Reference is made to FIGS. 1 and 2, a step of one embodiment of the present disclosure is described herein: First, in step S201, The central monitoring computer 121 within the central server 12 receives each kind of physical parameters and a performance value, detected by the detecting elements 110 of the air conditioning equipment 11 at every predetermined interval (e.g. per hour). The central monitoring computer 121 also stores the plurality of physical parameters and the performance value as a set of the first parameters and a first performance value. The set of the first parameters and the first performance value are shown in the following table:

$[X_{11}\ X_{12}\ X_{13}\ \ldots\ X_{1n}\ Y_1]$
$[X_{21}\ X_{22}\ X_{23}\ \ldots\ X_{2n}\ Y_2]$
$[X_{31}\ X_{32}\ X_{33}\ \ldots\ X_{3n}\ Y_3]$ In the above table, the $X_{11}$-$X_{1n}$ represents a first set of the first parameters, representing one of the vector data formed by the received each kind of physical parameters at the same time or in the same time range. Y1 is a first performance value corresponding to the first set of the first parameters. Similarly, $X_{21}$-$X_{2n}$ represents the second set of the first parameters. $Y_2$ is the first performance value corresponding to the second set of the first parameters. In step S202, the central server 12 establishes a comparison database D1 (for example, the matrix shown in the table above) based on the stored each set of the first parameters and first performance value corresponding to each set of the first parameters. Data stored in the comparison database D1 is able to fully reflect the performance value of the air conditioning equipment 11 in different operating states (e.g. in different physical parameters).

The central monitoring computer 121 stores an inspection rule to determine whether sufficient data is stored in the comparison database D1. For example, does the data cover each seasonal weather such as high and low temperatures? The inspection rule include conditional ranges (e.g. different temperature, different humidity, different flow rate, etc). When the sets of the first parameters meet all the conditional ranges of the inspection rule, the central monitoring computer 121 confirms that the sufficient data is stored in the comparison database D1. Alternatively, the inspection rule may be a threshold value, for example, when the number of the sets of the first parameters exceeds 100, then the central monitoring computer 121 determines that sufficient data is stored in the comparison database D1.

In step S203, when the comparison database D1 is established, the preparation procedure of the performance forecasting method is completed. Then, after the air conditioning equipment 11 is in operation, the central server 12 receives each kind of other physical parameters and another performance value detected by the plurality of detecting elements 110, and stores each kind of other physical parameters and another performance value as a set of second parameters and a second performance value. The set of the second parameters and the second performance value are shown in the following table:

$[X_{n1}\ X_{n2}\ X_{n3}\ \ldots\ X_{nn}\ Y_n]$

In the table above, Xn1-Xnn represents the set of the second parameters that reflect the current operating state of the air conditioning equipment 11. Yn represents the second performance value corresponding to the set of the second parameters, which reflect the current operational efficiency of the air conditioning equipment 11. In step S204, the optimization system computer 122 within the central server 12 obtain the sets of the first parameters and the sets of the second parameters stored in the central monitoring computer 11. The optimization system computer 122 calculates the similarity between the sets of the second parameters and each set of the first parameters according to the law of cosine. As shown in the following formula, where A and B are substituted into the set of the first parameters and the set of the second parameters, respectively:

$$\cos\theta = \frac{A \cdot B}{\|A\| \, \|B\|} = \frac{\sum_{i=1}^{n} A_i \times B_i}{\sqrt{\sum_{i=1}^{n} (A_i)^2} \times \sqrt{\sum_{i=1}^{n} (B_i)^2}}$$

The data stored in the comparison database D1 cover a variety of situations (e.g., operating status under different temperatures, humidity, seasons). Thus, in step S205, before performance forecasting, the optimization system computer 122 selects out sets of the first parameters which have the similarity being greater than a selecting threshold.

The selecting threshold can be set by the operator, and the better is between 0.8 and 0.95. In step S206, the optimization system computer 122 calculates an expected performance value based on the plurality of the first performance values corresponding to the selected plurality sets of the first parameters. In one embodiment, the optimization system computer 122 averages the plurality of the first performance values corresponding to the selected plurality sets of the first parameters to obtain the expected performance value.

For example, if the optimized system computer 122 selects out two sets of the first parameters, the optimized system computer 122 calculates the average of the corresponding two first performance values (e.g. 80, 84) and takes the average (e.g. 82) as the expected performance value. However, in other embodiments, the expected performance value may also be calculated by a median or other formula.

Finally, in step S207, the optimized system computer 122 calculates an error value between the expected performance value and the second performance value to determine a performance decline degree of the air conditioning equipment 11. For example, if the expected performance value is 82 and the second performance value is 78, the error value is approximately 5%. This error value is able to represent the decline rate of the air conditioning equipment 11.

Figure 3:
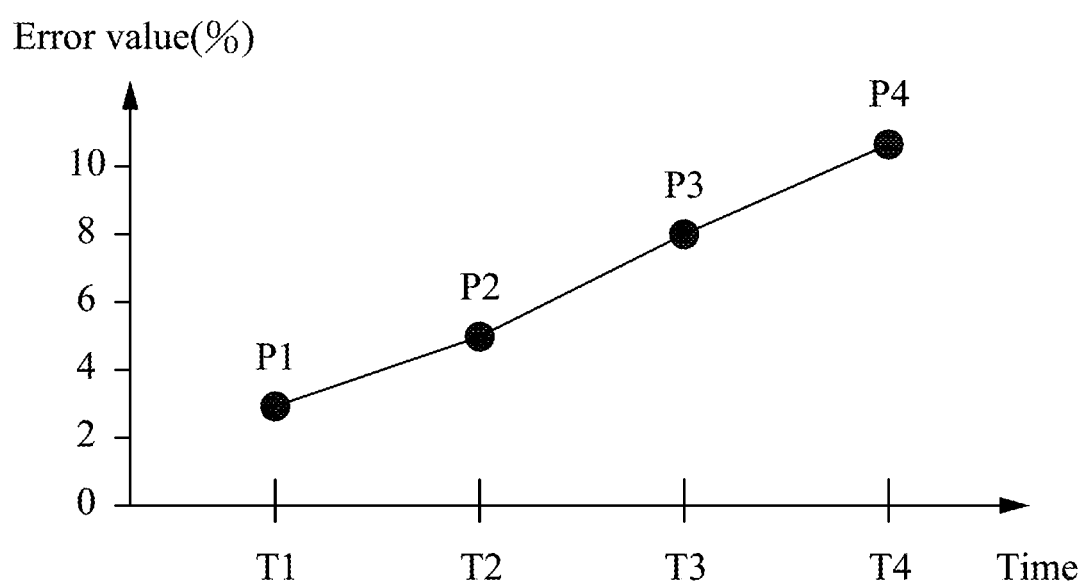
FIG. 3 shows a schematic diagram of a decline prediction line generated by the air conditioning system for one embodiment of the present disclosure.

Reference is made to FIG. 1 to 3, the central server 12 can determine whether a warning is needed based on the error value. In one embodiment, If the optimized system computer 122 determines that error value is greater than a decline threshold (e.g. 10%), the optimized system computer 122 within the central server 12 generates a warning message to notice the central monitoring computer 121 or other control terminal for maintaining the air conditioning equipment 11 on time.

Besides, If the optimized system computer 122 determines that the error value is greater than a warning threshold (e.g. 8%) but below the decline threshold (e.g. 10%), the optimized system computer 122 generate a maintenance message that reminds user to pay attention to the performance decline degree and to choose whether to maintain in advance.

In one embodiment, the optimization system computer 122 is able to periodically receive the plurality of physical parameters and performance value transmitted from the detecting elements 110 in order to calculate the error value periodically. The optimized system computer 122 also records a time parameter, which corresponding to the error value, to make a chart when calculating the error value.

Reference is made to FIG. 3, the optimization system computer 122 within the central server 12 automatically execute the performance forecasting method of the present disclosure at intervals. Therefore, after the optimization system computer 122 obtains the plurality of the error values and the plurality of the time parameters, the optimization system computer 122 generates a decline prediction line based on the plurality of the error values and the plurality of the time parameters chronologically. For example, the plural number of detection points P1 to P4 indicated in FIG. 3 represent the error values at four time points T1 to T4.

The optimization system computer 122 of the central server 12 calculates an estimated time point corresponding to the warning threshold on the decline prediction line. For example, the detection points P1 and P2 correspond to the error value is 1% and 5%, respectively. The optimization system computer 122 estimates an estimated time point (e.g. two weeks later), at which the error value corresponds to the warning threshold (e.g. 8%), based on the distances between the detection points P1 and P2 and the curvature or slope of the decline prediction line. If the optimization system computer 12 determines that a difference between the estimated time point and current time is less than a critical value (e.g. one month), the optimization system computer 12 generates a maintenance notification message.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:

1. A performance forecasting method applied to an air conditioning system, wherein the air conditioning system at least comprises an air conditioning equipment and a central server; a plurality of detecting elements are arranged on the air conditioning equipment and configured to detect a plurality of physical parameters and a performance value of the air conditioning equipment; the central server is connected to the plurality of detecting elements through wireless connection or wired connection, and the performance forecasting method comprises:

the central server receiving the plurality of physical parameters and the performance value detected by the plurality of detecting elements at every predetermined interval, and storing the plurality of physical parameters and the performance value as a set of first parameters and a first performance value;

the central server establishing a comparison database based on the stored each set of the first parameters and the first performance values corresponding to each set of the first parameters;

the central server receiving other physical parameters and another performance value detected by the plurality of detecting elements, and storing the other physical parameters and the another performance value as a set of second parameters and a second performance value;

the central server calculating a similarity between the set of the second parameters and each set of the first parameters in the comparison database according to the law of cosine;

the central server selecting out the sets of the first parameters which have the similarity being greater than a selecting threshold, and calculating an expected performance value based on the plurality of the first performance values corresponding to the selected plurality sets of the first parameters;

the central server calculating an error value between the expected performance value and the second performance value to determine a performance decline degree of the air conditioning system; and the central server generating a warning message and switching off the air conditioning equipment for maintenance when the error value is greater than a decline threshold.

2. The performance forecasting method of claim 1, further comprising:

the central server averaging the plurality of the first performance values corresponding to the selected plurality sets of the first parameters to obtain the expected performance value, after selecting sets of the first parameters.

3. The performance forecasting method of claim 2, wherein the selecting threshold is between 0.8 and 0.95.

4. The performance forecasting method of claim 3, further comprising:

the central server generating a maintenance message when the error value is greater than a warning threshold but below the decline threshold.

5. The performance forecasting method of claim 4, further comprising:

the central server recording a time parameter corresponding to the error value when the central server calculating the error value.

6. The performance forecasting method of claim 5, wherein the central server executes the performance forecasting method at intervals to obtain a plurality of the error values and a plurality of the time parameters, and the central server generates a decline prediction line based on the plurality of the error values and the plurality of the time parameters chronologically.

7. The performance forecasting method of claim 6, further comprising:

the central server calculating an estimated time point corresponding to the warning threshold on the decline prediction line.

8. The performance forecasting method of claim 7, further comprising:

the central server generating a maintenance notification message when a difference between the estimated time point and current time is less than a critical value.

9. The performance forecasting method of claim 8, wherein the physical parameters include temperature, flow rate or humidity, and the performance value is power consumption or heat exchange efficiency.

* * * * *